United States Patent [19]

Missios et al.

[11] 4,025,768
[45] May 24, 1977

[54] METHOD AND APPARATUS FOR TESTING AND DIAGNOSING DATA PROCESSING CIRCUITRY

[75] Inventors: Michael Herodotus Missios, Mission Viejo; John Richard Werner, Orange, both of Calif.

[73] Assignee: Burroughs Corporation, Detroit, Mich.

[22] Filed: May 24, 1976

[21] Appl. No.: 689,368

[52] U.S. Cl. .................. 235/153 AC; 235/153 AK; 340/172.5
[51] Int. Cl.$^2$ ....................................... G06F 11/00
[58] Field of Search ............ 235/153 AC, 153 AK, 235/153 A, 153 R; 340/172.5; 445/1

[56] References Cited

UNITED STATES PATENTS

| | | | |
|---|---|---|---|
| 3,548,177 | 12/1970 | Hartlipp et al. | 235/153 A |
| 3,723,868 | 3/1973 | Foster | 235/153 AC |
| 3,761,695 | 9/1973 | Eichelberger | 235/153 AC |
| 3,899,665 | 8/1975 | Gaon | 235/153 A |
| 3,916,306 | 10/1975 | Patti | 235/153 AC |

OTHER PUBLICATIONS

Irwin, Data Rate Changing for Diagnostic Purposes, IBM Technical Disclosure Bulletin, vol. 14, No. 11, Apr. 1972, pp. 3387-3388.

*Primary Examiner*—Charles E. Atkinson
*Attorney, Agent, or Firm*—Nathan Cass; Kevin R. Peterson; Edward J. Feeney, Jr.

[57] ABSTRACT

Improved methods and apparatus for testing and diagnosing defects in data processing networks and circuits. The presence of a time-dependent error in a network is determined by testing the network at normal and reduced clock frequencies. If a time-dependent error is found to be present, the clock period during which the error occurs is then determined by repeating the testing of the network at normal clock frequency a predetermined number of times with a different selected clock period being extended for each such repeated test operation. The amount of the clock period extension is chosen to be sufficiently long to prevent occurrence of a time-dependent error if it should occur during that clock period. The error clock period is then determined based on a determination of the particular repeated test operation for which the time-dependent error did not occur. The correct and error states of the network in the clock period immediately following the error clock period are then derived and compared for use in diagnosing the network.

14 Claims, 6 Drawing Figures

METHOD AND APPARATUS FOR TESTING AND DIAGNOSING DATA PROCESSING CIRCUITRY

BACKGROUND OF THE INVENTION

The present invention relates to improved means and methods for testing and diagnosing defects in data processing networks and circuits, and more particularly to improved means and methods for testing, diagnosing and isolating circuit defects responsible for the occurrence of time-dependent errors during the performance of data processing operations.

SUMMARY OF THE INVENTION

In a particular preferred form of the invention, the presence of an error in a network is determined by first applying a predetermined number of clock pulses to the network at a normal frequency, and then determining whether a correct result is obtained. If not, the test is repeated at a significantly reduced clock frequency. If the correct result is obtained for the reduced clock frequency, it may then be assumed that a time-dependent error is involved. In such a case, the particular clock period during which the time-dependent error occurs is determined. This is accomplished by repeating the test a predetermined number of times while operating at normal clock frequency, except that, for each such test, a different one of the clock periods is extended by an amount which could be expected to prevent the occurrence of a time-dependent error, if present, during that clock period. The particular clock period during which the time-dependent error occurs will then be identifiable as the one whose extension caused the correct result to be obtained at the end of the test. Both correct and error network flip-flop values for this identified clock period are then obtained and compared as an aid in determining the defective network component.

The specific nature of the invention as well as other objects, features, advantages and uses thereof will become readily apparent from the following detailed description taken in conjunction with the accompanying drawings.

DETAILED DESCRIPTION OF THE PREFERRED EMBODIMENT

Like characters and numerals refer to like elements and components throughout the figures of the drawings.

Figure 1:
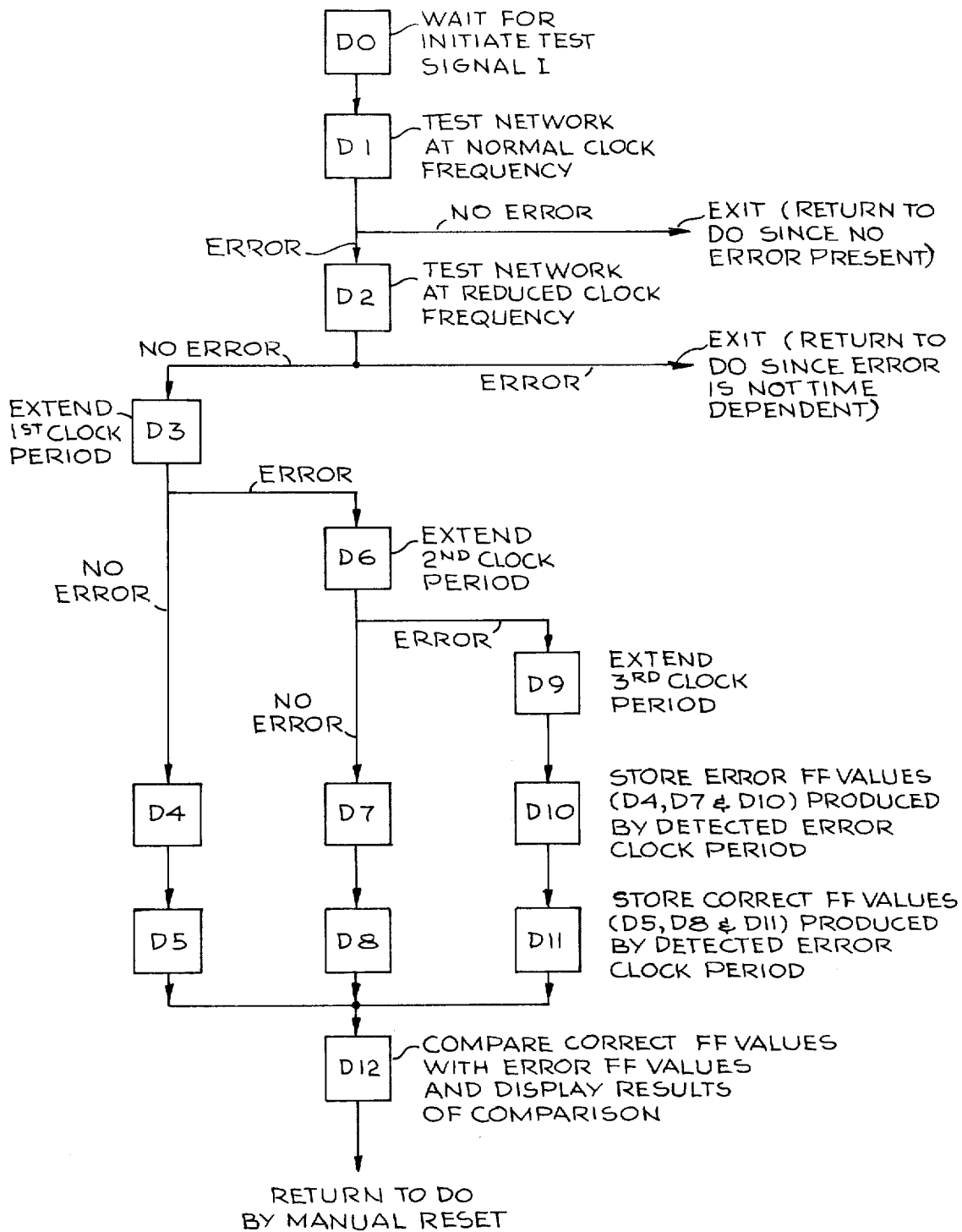
FIG. 1 is a flow diagram illustrating a program flow which may be employed for implementing the present invention.

Referring initially to the flow diagram of FIG. 1, illustrated therein is a program flow in accordance with the invention which may be provided for carrying out the invention using a testing and diagnosing system of a type such as illustrated, for example, in FIG. 2 and to be described in detail hereinafter. Each of the blocks D0, D1, - - - D12 in FIG. 1 represents a particular predetermined operation or associated group of operations performable by the system of FIG. 2.

Block D0 in FIG. 1 represents an initial condition during which the testing system awaits receipt of an Initiate Test Signal I which signals the testing and diagnosing system to initiate the performance of testing and diagnosing operations on a designated data processing network. When signal I arrives, the flow proceeds to block D1 in FIG. 1 during which a predetermined plurality of clock signals are applied to the network at normal clock frequency, after which the state values of the network flip-flops are checked to determine whether they are correct. If they are, the flow exits, since no error in the network is indicated.

However, as shown in FIG. 1, if at least one network flip-flop value is in error, the flow then proceeds to block D2 during which the same predetermined plurality of clock signals are again applied to the network, but at a reduced clock frequency chosen to be sufficiently slower than the normal clock frequency so as to prevent occurrence of a time-dependent error, if present, in the network. In other words, this test of the network at a reduced clock frequency during D2 serves to indicate whether the error detected in D1 is time-dependent. Thus, if the reduced clock frequency test performed in block D2 again produces an error result, it is an indication that the error is not time-dependent, and the flow then also exits. Other testing and diagnosing techniques (not pertinent to the present invention) will thus have to be used to find the cause of the error.

As indicated in FIG. 1, if no error occurs as a result of the reduced clock frequency test performed during D2, then a time-dependent error is indicated, and the flow proceeds to the remaining blocks beginning with D3 for the purpose of determining the particular clock time period during which the time-dependent error occurs. Thus, during block D3, the same predetermined plurality of clock pulses are again applied to the network at normal clock frequency, except that the first clock period (that is, the time between the occurrence of the first and second clock signals) is extended by an amount sufficient to prevent the time-dependent error from occurring, if present, during the first clock period. Typically, the first clock period is extended to correspond to the same time period between clock signals occurring for the reduced frequency test performed during D2.

As shown in FIG. 1, if the error still occurs when the test is repeated in block D3 with the first clock period extended, the flow then proceeds to block D6 where the same test is again repeated, except with the second clock period now being extended instead of the first clock period. If the error again occurs in block D6, flow then proceeds to block D9 for still another repeat of the test, but with the third clock period now being extended. For the sake of simplicity, the flow diagram of FIG. 1 assumes that the associated testing and diagnosing system (FIG. 2) is designed to determine the particular one of three consecutive clock time periods for which the time-dependent error occurs. Thus, the flow diagram of FIG. 1 does not provide for performing further testing beyond the third clock period. However, it will be evident that the flow diagram can readily be modified to accommodate any required number of clock period extensions which may be required by the particular testing and diagnosing system being used.

Continuing with the description of the flow diagram of FIG. 1, it will be understood that the flow proceeds to blocks D4, D7 or D10, depending upon which of the respective blocks D3, D6 or D9 produces a no error result. In other words, if block D3 which extends the first clock period produces a no error result, the flow then proceeds to block D4; if block D6 which extends the second clock period produces a no error result, the flow then proceeds to block D7; and if block D9 which extends the third clock period produces a no error result, the flow then proceeds to block D10.

In each of blocks D4, D7 and D10, the test on the network is performed at normal clock frequency in the same manner as during block D1, a normal clock frequency being used in order to again produce the error condition. In addition, provision is made for storing the network flip-flop values existing in the next clock period following the identified error clock period, since it is in this next clock period that the flip-flop values will manifest the error. For example, let it be assumed that a time-dependent error occurs in the second clock period, which is the time period between the second and third clock signals. For this assumption, block D6 which extends the second clock period will be the one which produces a no error result. The flow will thus proceed to block D7 which will store the network flip-flop values existing in the third clock period, since it is during this third period that the flip-flops will have values representative of the error occurring during the second clock period. This will be understood by noting that an error occurring during the second clock period will be set into the network flip-flops in response to the third clock signal which terminates the second clock period and begins the third clock period.

After storage of the error flip-flop values existing in the clock period following the error clock period during blocks D4, D7 or D10, as described above, the flow then proceeds to the next respective block D5, D8 or D11 whose purpose is to now store the correct flip-flop values that should exist during the clock period following the identified error clock period. A convenient way of accomplishing this purpose is to have each of blocks D5, D8 and D11 perform the same test as was performed by its respective previous block D3, D6 or D9 during which a respective one of the first, second and third clock periods is extended. As a result, a no error condition will be produced for each of whichever of blocks D5, D8 or D11 to which the flow has progressed. It is then merely necessary to provide in each of blocks D5, D8 and D11 for storing the correct flip-flop values which will thus now exist in the clock period following the identified error clock period determined in the previous respective blocks D3, D6 and D9.

Still with reference to the flow diagram of FIG. 1, it will be seen that after operations in either of blocks D5, D8 or D11 (depending upon which is the error clock period), the flow proceeds to the final common block D12 during which the error and correct network flip-flop values stored during the previous two blocks (D4 and D5, D7 and D8 or D10 and D11) are compared and the results displayed for use in diagnosing the cause of the error.

Figure 2:
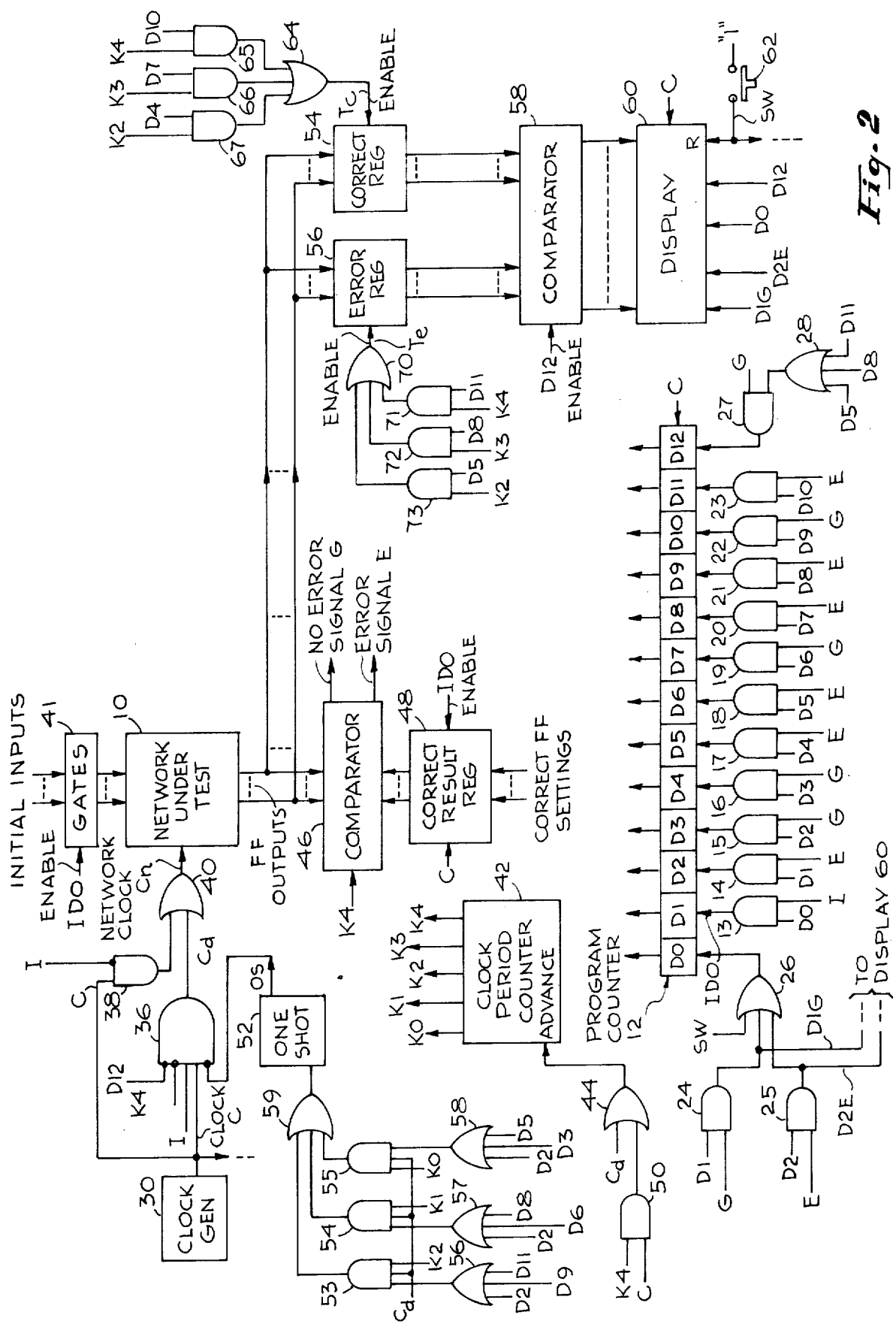
FIG. 2 is an electrical diagram illustrating an embodiment of a testing and diagnosing system in accordance with the invention for carrying out the flow diagram of FIG. 1.

Referring next to FIG. 2, illustrated therein is an exemplary embodiment of a testing and diagnosing system which may be employed for carrying out the flow diagram of FIG. 1. At this point in the description, it will be useful to note that the flow diagram of FIG. 1 is to be considered as representative of one of the many possible ways in which the purposes and advantages of the invention can be achieved, and that the embodiment of FIG. 2 is representative of one particular example of a possible implementation that can be employed in accordance with the invention for carrying out the particular flow diagram illustrated in FIG. 1.

Figure 3:
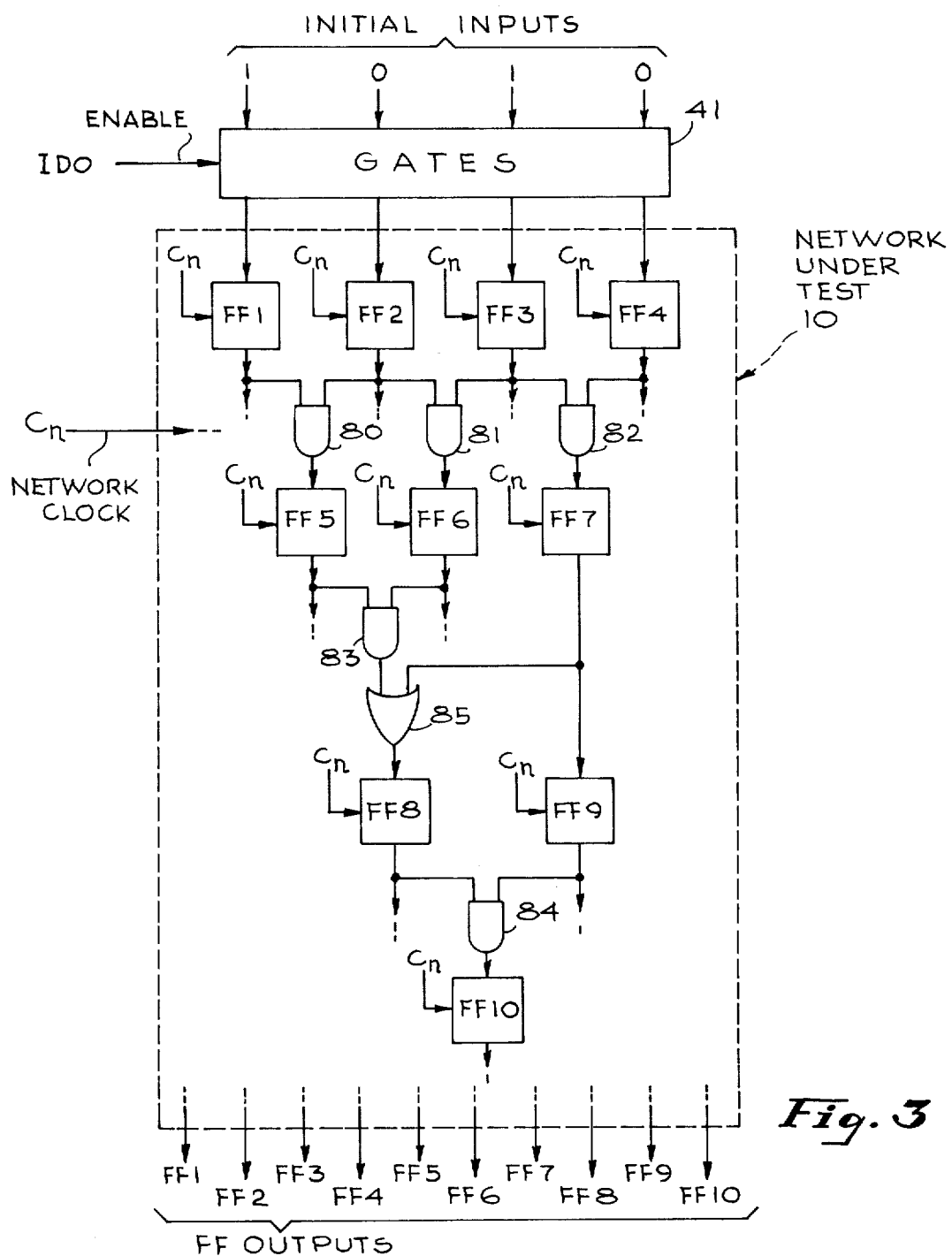
FIG. 3 is an electrical circuit diagram illustrating an example of a multi-state digital network which may be tested and diagnosed using the implementation of the invention illustrated in FIGS. 1 and 2.

Thus, with reference to FIG. 2, it will be noted that the network to be tested is indicated by the numeral 10 and will be assumed to comprise a plurality of flip-flops interconnected by logic circuitry. An example of a network suitable for testing and diagnosing in accordance with the invention is illustrated in FIG. 3. It is assumed that each flip-flop of this network as well as those employed in the registers and counters in the embodiment of FIG. 2 are each of a conventional type which, in response to an applied clock signal, is set to a "1" or "0" state or value depending upon the logical "1" or "0" value applied to the flip-flop data input when the clock signal occurs. It will further be assumed that, as is conventional, appropriate delays are provided in the inputs and/or outputs of the flip-flops to prevent the switching of the flip-flops in response to a clock pulse from prematurely affecting the current inputs applied to the flip-flops.

Initially, it will be helpful to note that, for ease of comparison and explanation, each of the blocks D0, D1 - - - D12 in the flow diagram of FIG. 1 is represented by a single corresponding one of the program counts D0 – D12 of a conventional form of program counter, such as indicated by the numeral 12 in FIG. 2. As is well known, a program counter typically serves to control the sequencing of operations so as to provide a desired program flow. Accordingly, the program counter in FIG. 2 is caused to provide the program flow illustrated in FIG. 1 by appropriate choice of the particular input logic circuitry provided at the program counter inputs. In FIG. 2, these program counter inputs comprise AND gates 13–23 for program counts D1 – D11, respectively, AND gates 24 and 25 and OR gate 26 for program count D0, and AND gate 27 and OR gate 28 for program count D12.

Clocking may be derived for the embodiment of FIG. 2 using a clock generator 30 which produces a basic clock C at normal clock frequency. The basic clock C may also be obtained from the clock usually available from an associated data processing unit (not shown) in conjunction with which the embodiment of FIG. 2 is typically employed. This normal frequency clock C is converted into a network clock $C_n$ for application to the network 10 using logic circuitry comprising AND gates 36 and 38 and OR gate 40. The output of an initiate signal I (which is true or "1" during testing and diagnosing operations) is applied to an inverse input of AND gate 38 along with the clock C so as to permit the clock C to be applied to the network 10 under normal operating conditions while inhibiting application of clock C during testing and diagnosing operations. Signal I is also applied to AND gate 36 for combination with various other inputs in order to provide a test clock $C_d$ which is applied to the network 10 for testing and diagnosing purposes. Signal ID0 obtainable from the output of AND gate 13 at the D1 input of program counter 12 serves to enable AND gates 41 so as to cause appropriate initial inputs to be applied to the network 10.

Figure 5:
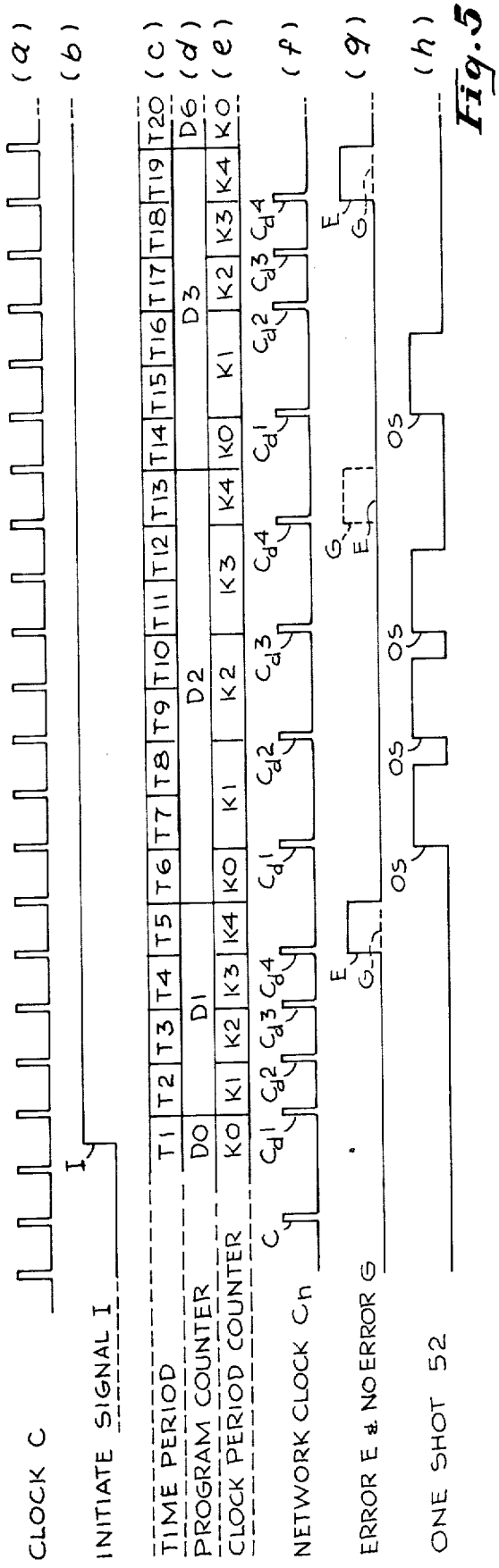
FIGS. 5 and 6 are timing graphs illustrating the operation of the embodiment of FIG. 2 for a particular assumed example of a time-dependent error occurring in the network of FIG. 3 during the second clock period K2.
Figure 6:
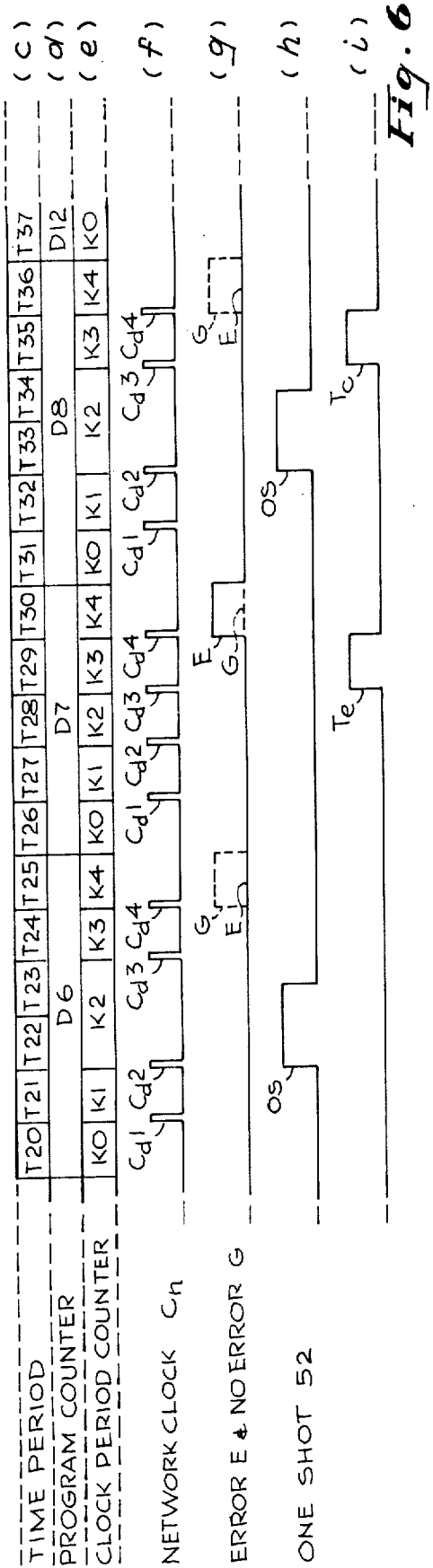

Reference is now directed to FIGS. 5 and 6 along with FIG. 2, it being understood that FIGS. 5 and 6 together illustrate one possible example of testing and diagnosing operations in accordance with the invention, FIG. 6 being a continuation of FIG. 5. FIG. 5(a) illustrates a typical clock C, such as may be provided by the clock generator 30 in FIG. 2. FIG. 5(b) illustrates the initiate signal I, such as may be provided, for example, by an associated data processor (not shown). As indicated, signal I remains true or "1" until testing and diagnosing operations are completed. FIGS. 5(c) and 6(c) designate consecutive time periods T1, T2, etc., of the basic clock C occurring during the typical example of testing and diagnosing operations illustrated in FIGS. 5 and 6. FIG. 5(d) designates the program counter states D0, D1, - - - D12 of the program counter 12 existing during particular time periods of this typical example. FIGS. 5(e) and 6(e) designate the states K0, K1, - - - K4 of a clock period counter 42 which serves to indicate the particular one of the clock periods K0, K1, K2, K3 or K4 existing during particular time periods. FIGS. 5(f) and 6(f) illustrate the network clock $C_n$ applied to the network 10 which, during testing operations, is merely the test clock $C_d$.

As shown in FIG. 2, the test clock $C_d$ is applied to the clock period counter 42 via OR gate 44 for the purpose of successively advancing the counter 22 from K0 to K4 for the typical example illustrated in FIGS. 5 and 6. Count K4 of the clock period counter 42 designates the test period during which the final network flip-flop values — that is, those existing after the fourth test clock $C_d4$ (FIGS. 5(f) and 6(f)) — are compared in a comparator 46 (enabled by K4) with correct flip-flop values previously set into a correct result register 48 in response to the same signal ID0 which enables AND gates 41. The clock period counter 42 is caused to return to its initial count K0 after K4 at the next clock C as a result of count K4 being true to permit the clock C to pass through AND gate 50 and OR gate 44 to return the counter 42 back to K0.

FIGS. 5(g) and 6(g) illustrate the error signal E or no error signal G produced by the comparator 46 in FIG. 2 during K4, a no error signal G being produced if the network flip-flop values correctly match those in the correct result register 48, or an error signal E being produced if at least one network flip-flop value is in error.

FIGS. 5(h) and 6(h) illustrate the triggering of one-shot 52 in FIG. 2 which is turned on by the test clock $C_d$ (FIG. 5(f)) during particular time periods in order to provide for the reduced frequency testing performed in program count D2, and also to provide for extending the particular first, second or third clock periods K1, K2 and K3 required for program counts D3, D5, D6, D8, D9 and D10, as previously described in connection with FIG. 1. This is accomplished by causing the one-shot 52 to be triggered on by the test clock $C_d$ during appropriate clock periods (K1, K2 and/or K3) of these program counts using logic circuitry at the one-shot triggering input, such as typically illustrated in FIG. 2 by the one-shot input logic circuitry comprising AND gates 53–55 and OR gates 56–59. The output OS of one-shot 52 is applied to an inverse input of AND gate 36 and is chosen to have an on time such that it prevents the next occurring clock C from passing through AND gate 16, thereby preventing generation of the test clock $C_d$ when the next clock occurs. It will thus be understood that, since the one-shot 32 is triggered at the beginning of each of the clock periods K1, K2 and K3 in the reduced frequency test of program count D2, the test clock $C_d$ is generated for every other one of the basic clocks C, rather than for every clock C as during program count D1, thereby providing the test clock $C_d$ to the network 10 during D2 at a frequency equal to one-half that of the basic clock C, which is a suitable reduced frequency for the reduced frequency test required during D2. It will also be understood that, for each of program counts D3, D5, D6, D8, D9 and D11, the one-shot 32 is triggered only at the beginning of the particular respective clock period which is to be extended during each of these program counts, thereby extending this particular clock period to a time twice that of the normal clock period.

It will be noted that the last half of the example illustrated in FIG. 6 does not repeat the clock C and initiate signal I graphs (a) and (b) of FIG. 5, since they occur in the same manner during the time periods of FIG. 6. However, FIG. 6 adds the additional graph (i) in order to illustrate the operations of the portions of FIG. 2 directed to performing blocks D4, D5, D7, D8, D10, D11, whereby the error and correct flip-flop values of network 10 occurring in the clock period following the identified error clock period are stored in respective correct and error registers 54 and 56 in FIG. 2, and then compared in a comparator 58 which is enabled during block D12, the results of this comparison being set up in a display 60 for diagnosing purposes. FIG. 6(i) illustrates transfer signals Te and Tc which are generated in the example of FIGS. 5 and 6 for enabling the correct and error registers 54 and 56 during the appropriate time periods so as to respectively store therein the error and correct network flip-flop values used for comparison during D12. The transfer signal Tc is provided for the correct register 54 using logic circuitry comprised of OR gate 64 and AND gates 65–67, and the transfer signal Te is provided for the error register 56 using logic circuitry comprised of OR gate 70 and AND gates 71–73.

With regard to display 60, it will be noted that a manual switch 62 is provided which when depressed provides a switch signal Sw for resetting the display. The switch signal Sw is also applied to AND gate 26 at the D0 input of the program counter 12 for resetting the program counter 12 back to D0. Program counts D0–D12 are preferably also applied to the display 60 to permit the display 60 to indicate when the system is in these states, and the particular flow path occurring during a testing and diagnosing operation. It is also advantageous to apply to the display the signals D2E and D1G produced at the respective outputs of AND gates 24 and 25 of the D0 input logic circuitry in order to permit the display to indicate the occurrence of an exit from the flow following D1 or D2. As previously described in connection with the flow diagram of FIG. 1, an exit will occur following D1 (as indicated by D1G becoming true during D1) if there is no resultant flip-flop error detected in network 10, while an exit will occur after D2 (as indicated by D2E becoming true during D2) if an error is detected but is of a type which is not corrected by the reduced frequency operation provided during D2.

Figure 4:
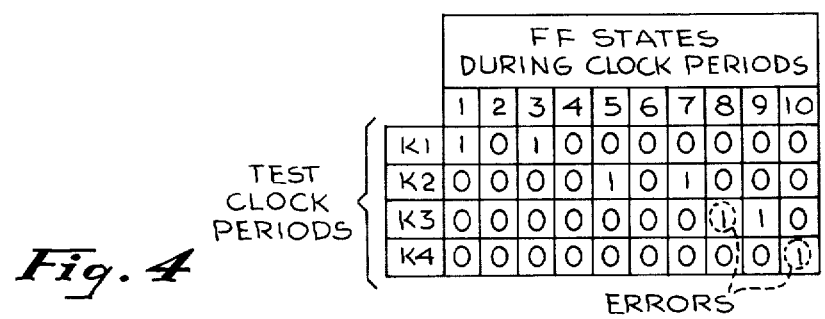
FIG. 4 is a table illustrating the states of the flip-flops of the network of FIG. 3 during four consecutively occurring clock periods K1, K2, K3 and K4.

A more detailed understanding of the construction and operation of the illustrative embodiment of the testing and diagnosing system shown in FIG. 2 can be obtained from the typical example of system operation set forth in FIGS. 4–6. This typical example is based on the following considerations:

1. It is assumed that the network 10 to be tested and diagnosed is that shown in FIG. 3 comprising the 10 flip-flops FF1–FF10 and the various interconnecting AND gates 80–84 and OR gate 85.

2. The presence of a time-dependent error in the network of FIG. 3 is determined for the three consecutive clock periods K1, K2 and K3 (FIGS. 5(e) and 6(e)).

3. It is assumed that the initial inputs applied to the network of FIG. 3 are the binary signals "1", "0", "1" and "1" which, as shown in FIG. 3, are respectively applied to the data inputs of flip-flops FF1, FF2, FF3 and FF4, via AND gates 49, and set up therein in response to the occurrence of each first test clock $C_d1$ (FIGS. 5(f) and 6(f)). FIG. 4 illustrates the states of each of the network flip-flops FF1–FF10 during each of clock periods K1, K2, K3 and K4 occurring following test clocks $C_d1$, $C_d2$, $C_d3$ and $C_d4$, respectively.

4. It is also assumed that a time-dependent error occurs in network 10 of FIG. 3 as a result of a defective OR gate 85 which, at a reduced clock frequency, correctly causes a "1" to be applied to FF8 during K2; however, at normal clock frequency, OR gate 85 responds too slowly, thereby causing a "0" to be incorrectly applied to FF8 during K2 with the result that, during the next following clock period K3, FF8 will incorrectly have a "0" value (as indicated by the dashed "0" in FIG. 4) instead of a "1". The final result obtained in clock period K4 occurring following test clock $C_d4$ will thus have FF10 with an incorrect "0" value instead of a "1" shown in FIG. 4 by the dashed "0" indicated for FF10 during K4.

Based on the above considerations and the previous description of FIG. 1, it will be understood that the embodiment of FIG. 2 will consecutively sequence through the program counts D0, D1, D2, D3, D6, D7, D8 and D12 (FIGS. 5(d) and 6(d)) in performing this specific example. This program count sequence is the program count sequence illustrated in FIGS. 5(d) and 6(d) occurring over the time periods T1–T37 (FIGS. 5(f) and 6(f)). The specific activity occurring in the embodiment of FIG. 2 and the network of FIG. 3 for each of these time periods will be readily evident to one skilled in the art from a consideration of FIGS. 4–6 along with FIGS. 1–3. In particular, it will be understood that during D7, the states of flip-flops FF1–FF10 existing during K3 and containing an error in FF8 will be stored in error register 56, and that, during D8, the correct states of flip-flops FF1–FF10 existing during K3 will be stored in correct register 54, the results of the comparison therebetween performed during D12 being displayed by display 60. Since for the illustrative example being considered, display 60 will indicate that FF8 had an incorrect value during K2, it can be diagnosed that OR gate 85 is most likely defective in the FIG. 3 network, since it should have permitted the "1" state of FF7 existing during K2 (see FIG. 4) to be applied therethrough to set FF8 to a "1" state during K3.

Although the description herein has been primarily concerned with particular embodiments and examples illustrating the construction and operation of the invention, it is to be understood that the invention is subject to a wide variety of possible modifications and variations without departing from the true scope thereof. For example, it is to be understood that the invention may also be implemented by software and/or a combination of both hardware and software. Accordingly, the present invention should be considered as encompassing all possible modifications, variations and alternative implementations coming within the broad scope of the invention as defined by the appended claims.

What is claimed is:

1. In an automatically performable, electronically implemented method of testing a network exhibiting a time-dependent error and constructed and arranged for operation in response to applied clock signals, the steps of:

repeatedly applying input data and a predetermined plurality of clock signals to said network with a different clock period being extended for each application of said input data and said predetermined plurality of clock signals, the amount of each extension being chosen to prevent occurrence of a time-dependent error if it occurs during that clock period;

checking the correctness of operation of said network for each application of said input data and said predetermined plurality of clock signals; and determining the clock period during which said time-dependent error occurs based on a determination of the particular application of said input data and said predetermined plurality of clock pulses which results in preventing occurrence of said error.

2. The invention in accordance with claim 1, wherein the step of checking comprises comparing the result provided by said network after application of said input data and said predetermined plurality of clock signals with the correct result which would be obtained if no error is present in the network.

3. The invention in accordance with claim 2, including the step of comparing the result provided by said network in the clock period immediately following the identified error clock period with the result that would be obtained if no error were present.

4. In an automatically performable, electronically implemented method of testing a multi-state digital network constructed and arranged for operation in response to applied clock signals, the steps of:

determining the presence of a time-dependent error in said network;

repeatedly applying input data and a predetermined plurality of clock signals to said network with a different selected one of the clock periods being extended for each application of said input data and said predetermined plurality of clock signals, the amount of each clock period extension being chosen to prevent occurrence of a time-dependent error if it occurs during that clock period;

checking the correctness of said at least one state of said network after each application of said input data and said predetermined plurality of clock signals; and determining the particular clock period during which said error occurs based on a determination of the particular application of said input data and said predetermined plurality of clock signals which results in preventing occurrence of said error.

5. The invention in accordance with claim 4, including the steps of:
deriving the error and correct states of said network in the clock period immediately following the identified error clock period;
comparing the derived error and correct states of said network; and
displaying the results of the comparison of said error and correct states.

6. The invention in accordance with claim 4, wherein the step of determining the presence of a time-dependent error comprises:
applying said input data and said predetermined plurality of clock signals to said network without providing any clock period extensions and checking for the occurrence of an error in the result obtained; and
again applying said input data and said predetermined plurality of clock signals to said network but at a reduced frequency sufficient to prevent occurrence of said error if it is of a time-dependent type.

7. In an automatically performable, electronically implemented method of testing a multi-state digital network constructed and arranged for operation in response to applied clock signals, the steps of:
applying input data and a predetermined plurality of clock signals to said network at a first frequency during which said input data applied to said network is processed, the states of said network being indicative of the processing of said input data;
checking the correctness of at least one state of said network after application thereto of said input data and said predetermined plurality of clock signals at said first frequency;
in the event said checking indicates an error, applying said input data and said predetermined plurality of clock signals to said network at a significantly reduced clock frequency chosen to prevent occurrence of a time-dependent error;
checking the correctness of said at least one state of said network after application thereto of said predetermined plurality of clock signals at said reduced frequency;
in the event said checking at said reduced frequency indicates a correct result, repeating at least one more time the application of said predetermined plurality of clock signals to said network at said first frequency with a different selected one of the clock periods being extended during each such repeating by an amount sufficient to correct said error if it occurs during that clock period;
checking the correctness of said at least one state of said network after each repeat operation;
determining the particular clock period during which said error occurs based on a determination of which of the repeated applications of said input data and said predetermined plurality of clock signals to said network achieves a correct result;
deriving the error and correct states of said network in the clock period immediately following the identified error clock period; and
comparing the derived error and correct states of said network for use in diagnosing said network.

8. The invention in accordance with claim 7, wherein said reduced frequency is chosen so that the resulting reduced frequency clock period is equal to an extended clock period at said first frequency.

9. The invention in accordance with claim 7, wherein the step of deriving said error and correct states comprises:
applying said input data and said predetermined plurality of clock signals to said network at said first frequency without extension of the identified error clock period and storing the states of said network in the clock period immediately following the identified error clock period, whereby said error states are derived; and
applying said input data and said predetermined plurality of clock signals to said network with the identified error clock period extended and storing the states of said network in the clock period immediately following the identified error clock period, whereby said correct states are derived.

10. The invention in accordance with claim 7, including the step of displaying the results of comparing said error and correct states of said network.

11. In a system for testing a network exhibiting a time-dependent error and constructed and arranged for operation in response to applied clock signals, the combination of:
means for repeatedly applying input data and a predetermined plurality of clock signals to said network with a different clock period being extended for each application of said input data and said predetermined plurality of clock signals, the amount of each extension being chosen to prevent occurrence of a time-dependent error if it occurs during that clock period;
means for checking the correctness of operation of said network for each application of said input data and said predetermined plurality of clock signals; and
means for determining the clock period during which said time-dependent error occurs based on a determination of the particular application of said input data and said predetermined plurality of clock pulses which results in preventing occurrence of said error.

12. In a system for testing a multi-state digital network constructed and arranged for operation in response to applied clock signals, thecombination of:
means for determining the presence of a time-dependent error in said network;
means for repeatedly applying input data and a predetermined plurality of clock signals to said network with a different selected one of the clock periods being extended for each application of said input data and said predetermined plurality of clock signals, the amount of each clock period extension being chosen to prevent occurrence of a time-dependent error if it occurs during that clock period;
checking the correctness of said at least one state of said network after each application of said input data and said predetermined plurality of clock signals; and
means for determining the particular clock period during which said error occurs based on a determination of the particular application of said input data and said predetermined plurality of clock signals which results in preventing occurrence of said error.

13. The invention in accordance with claim 4, including:
   means for deriving the error and correct states of said network in the clock period immediately following the identified error clock period;
   means for comparing the derived error and correct states of said network; and
   means for displaying the results of the comparison of said error and correct states.

14. In a system for testing and diagnosing a multistate digital network constructed and arranged for operation in response to applied clock signals, the combination of:
   means for applying input data and a predetermined plurality of clock signals to said network at a first frequency during which said input data is processed, the states of said network being indicative of the processing of said input data;
   means for applying said predetermined plurality of clock signals to said network at a significantly reduced clock frequency chosen to prevent occurrence of a time-dependent error if present in said network;
   means for checking the correctness of said at least one state of said network after application thereto of said predetermined plurality of clock signals at said first frequency and after application thereto at said reduced frequency for determining the presence of a time-dependent error in said network;
   means for repeating the application of said predetermined plurality of clock signals to said network at said first frequency a predetermined number of times determined by the number of clock periods which are to be checked for occurrence of said error, each such repeating extending a different one of the clock periods by an amount sufficient to correct said error if it occurs during that clock period;
   means for determining the particular clock period during which said error occurs based on a determination of which of said repeated applications results in correction of said error;
   means for deriving the correct and error states of said network in the clock period immediately following the identified error clock period; and
   means for comparing said error and correct states and for indicating the results of this comparison.

* * * * *